(12) United States Patent
Hsu et al.

(10) Patent No.: US 8,803,600 B2
(45) Date of Patent: Aug. 12, 2014

(54) OUTPUT BUFFER CIRCUIT CAPABLE OF ENHANCING STABILITY

(75) Inventors: Xie-Ren Hsu, Hsinchu (TW); Ji-Ting Chen, Hsinchu County (TW); Yao-Hung Kuo, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/592,368

(22) Filed: Aug. 23, 2012

(65) Prior Publication Data

US 2012/0319770 A1    Dec. 20, 2012

Related U.S. Application Data

(63) Continuation of application No. 13/014,672, filed on Jan. 26, 2011, now Pat. No. 8,278,999.

(30) Foreign Application Priority Data

Feb. 4, 2010    (TW) .............................. 99103316 A

(51) Int. Cl.
*H03F 1/02*    (2006.01)
(52) U.S. Cl.
USPC .............................. 330/9; 330/284; 330/144
(58) Field of Classification Search
USPC ............................................. 330/9, 284, 144
See application file for complete search history.

(56) References Cited

U.S. PATENT DOCUMENTS

| | | | |
|---|---|---|---|
| 3,659,190 A | 4/1972 | Galluppi | |
| 6,556,083 B2 * | 4/2003 | Kadanka | 330/292 |
| 6,753,699 B2 * | 6/2004 | Stockstad | 326/83 |
| 7,064,532 B1 | 6/2006 | Suzuki | |
| 7,064,575 B2 | 6/2006 | Lou | |
| 7,375,992 B2 * | 5/2008 | Mok et al. | 363/60 |
| 7,385,377 B2 * | 6/2008 | Pisasale et al. | 323/267 |
| 7,760,019 B2 * | 7/2010 | Johansson | 330/252 |
| 7,760,180 B2 | 7/2010 | Shimatani | |
| 2011/0169990 A1 * | 7/2011 | Higuchi et al. | 348/302 |

FOREIGN PATENT DOCUMENTS

| | | |
|---|---|---|
| CN | 1702729 A | 11/2005 |
| CN | 1987711 A | 6/2007 |
| CN | 100578596 C | 1/2010 |

* cited by examiner

*Primary Examiner* — Patricia Nguyen
(74) *Attorney, Agent, or Firm* — Winston Hsu; Scott Margo

(57) ABSTRACT

An output buffer circuit capable of enhancing stability includes an operational amplifier, a capacitive load and an output control unit. The operational amplifier has a positive input terminal, a negative input terminal and an output terminal, and generates an output voltage to the output terminal according to an input voltage received by the positive input terminal. The output control unit is coupled between the output terminal of the operational amplifier and the capacitive load, and is utilized for controlling electrical connection between the output terminal of the operational amplifier and the capacitive load to form a signal output path and for adjusting impedance of the signal output path when the signal output path is formed. The output control unit comprises a plurality of output switches for individually turning on or off the electrical connection between the output terminal and the capacitive load of the operational amplifier.

33 Claims, 7 Drawing Sheets

OUTPUT BUFFER CIRCUIT CAPABLE OF ENHANCING STABILITY

CROSS REFERENCE TO RELATED APPLICATIONS

This a continuation application of U.S. application Ser. No. 13/014,672 filed on Jan. 26, 2011, which is included in its entirety herein by reference.

BACKGROUND OF THE INVENTION

1. Field of the Invention

The present invention relates to an output buffer circuit capable of enhancing stability, and more particularly to an output buffer circuit that increases a phase margin of an operational amplifier by adjusting output path impedance of the operational amplifier.

2. Description of the Prior Art

Output buffers are usually applied to various electronic devices for isolating signals from input terminals to output terminals to avoid the input terminals being affected by loading and for enhancing driving ability. In Liquid Crystal Display (LCD) devices, for example, source drivers charge each pixel in LCD panels to an individual voltage level to drive liquid crystal molecules of each pixel by using the output buffers. Hence, the driving ability of the output buffer is highly related to display performance and responding time of the LCD devices.

Please refer to FIG. 1, which is a schematic diagram of a conventional source driver 10. The source driver 10 includes a shift register 11, a data latch (or known as a line buffer) 12, a digital-to-analog converter (DAC) 13, an output buffer 14, and an output switch 15. The shift register 11 is utilized for sequentially receiving image data DATA according to a clock signal CLK. When the image data corresponding to a horizontal scan line data is received, the data latch 12 grabs the data temporarily stored in the shift register 11 according to a data loading signal LOAD generated by a timing controller (not shown), such that the shift register 11 can proceed to receive the image data of a next horizontal scan line. The DAC 13 then converts the digital pixel data stored in the data latch 12 to analog voltages and outputs the analog voltages to the output buffer 14. The output buffer 14 is utilized for providing sufficient driving ability, and the output switch 15 is utilized for sequentially coupling the output buffer 14 to a corresponding data line DL. Accordingly, the data line DL can be drove.

In FIG. 1, the output buffer 14 and the output switch 15 is known as an output buffer circuit of the source driver 10. More specifically, as shown in FIG. 2, the output buffer 14 includes an operational amplifier 110, and the output switch 15 includes a switch SW for forming a signal path to the data line DL via an output pad P of the source driver 10. The operational amplifier 110 has a positive input terminal IN+, a negative input terminal IN− and an output terminal OUT. The positive input terminal IN+ is utilized for receiving an analog voltage. The output terminal OUTPUT is coupled to the negative input terminal IN− to form a negative feedback loop. The operational amplifier 110 is utilized for driving the voltage of the output pad P to a certain voltage level according to the analog voltage received by the positive input terminal IN+. However, in order to drive different pixels of the data line DL at different time, the source driver 10 must renew the analog voltage frequently. The source driver 10 turns off the switch SW when renewing the analog voltage, and turns on the switch SW for outputting the analog voltage being renewed to the data line DL until the data line DL is ready to be charged.

When the switch SW is turned on, the output terminal OUT of the operational amplifier 110 is electrically connected to the data line DL through the output pad P. In general, the stabilization time of the output voltage is determined by capacitive load CLOAD of the date line DL, turn-on impedance of the switch SW and output impedance of the operational amplifier 110. However, in order to decrease power loss, the conventional source driver continuously reduces the DC currents of the output buffer, causing that a phase margin of the operational amplifier is decreased and thus the stabilization time is increased. Under this condition, it is inevitable to postpone the testing time of the output voltage, resulting in the increase of the testing cost.

SUMMARY OF THE INVENTION

It is therefore an objective of the claimed invention to provide an output buffer circuit capable of enhancing stability.

The present invention discloses an output buffer circuit capable of enhancing stability. The output buffer circuit includes an operational amplifier, a capacitive load, and an output control unit. The operational amplifier has a positive input terminal, a negative input terminal and an output terminal reversely coupled to the negative input terminal, and is utilized for generating an output voltage with a corresponding level to the output terminal according to an input voltage received by the positive input terminal. The output control unit is coupled between the output terminal of the operational amplifier and the capacitive load, and is utilized for controlling electrical connection between the output terminal of the operational amplifier and the capacitive load to form a signal output path and for adjusting the impedance of the signal output path when the signal output path is formed. The output control unit comprises a plurality of output switches, for individually turning on or off the electrical connection between the output terminal and the capacitive load of the operational amplifier, to form the signal output path, wherein the impedance of the signal output path is determined by quantity of turned-on output switches among the plurality of output switches.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
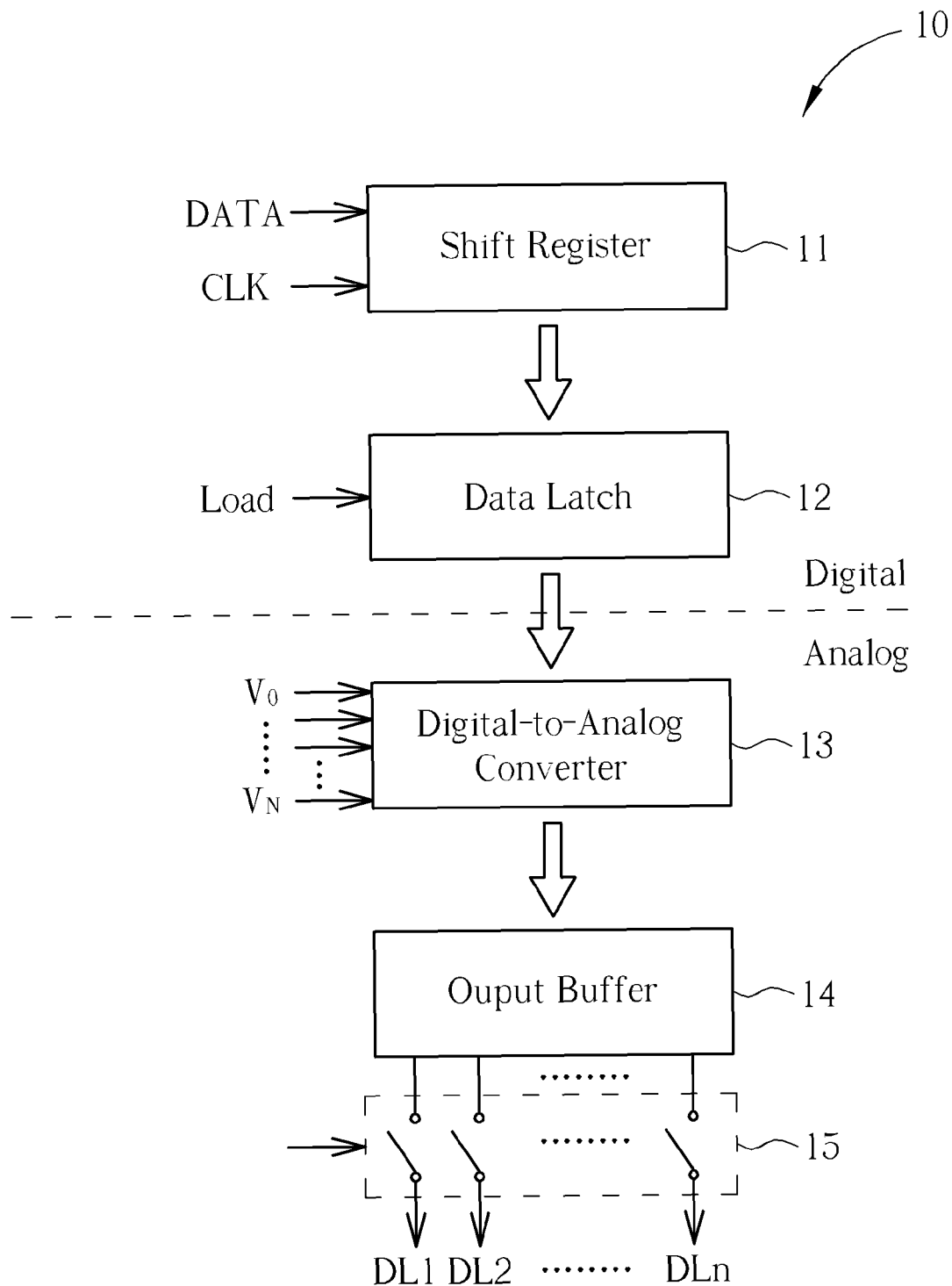
FIG. 1 is a schematic diagram of a conventional source driver.
Figure 2:
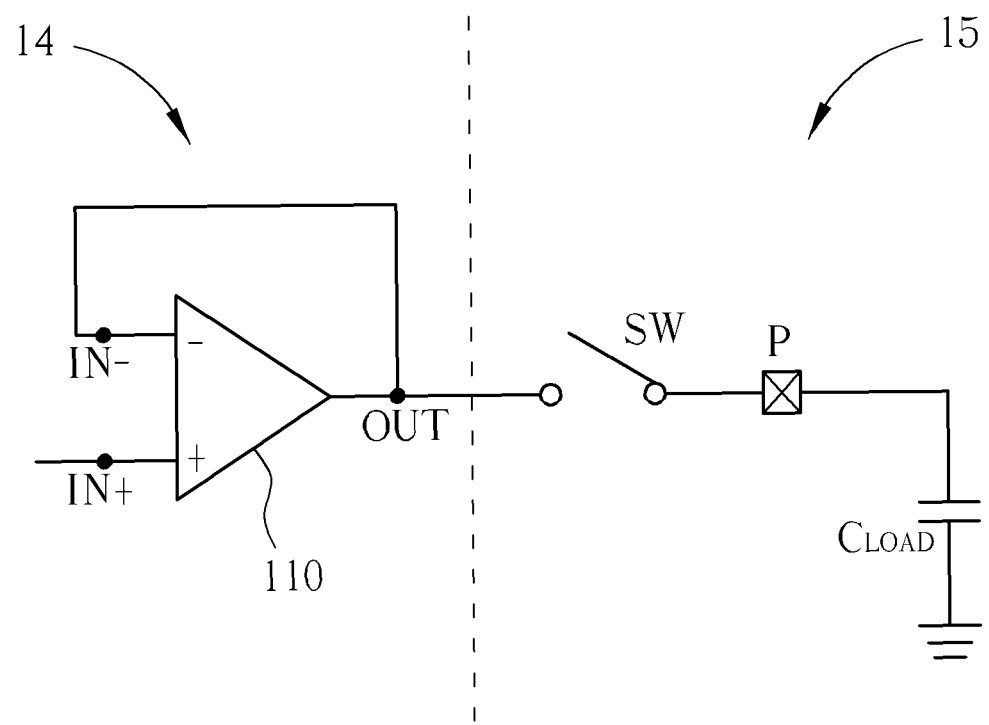
FIG. 2 is a schematic diagram of an output buffer circuit of the source driver in FIG. 1.
Figure 3:
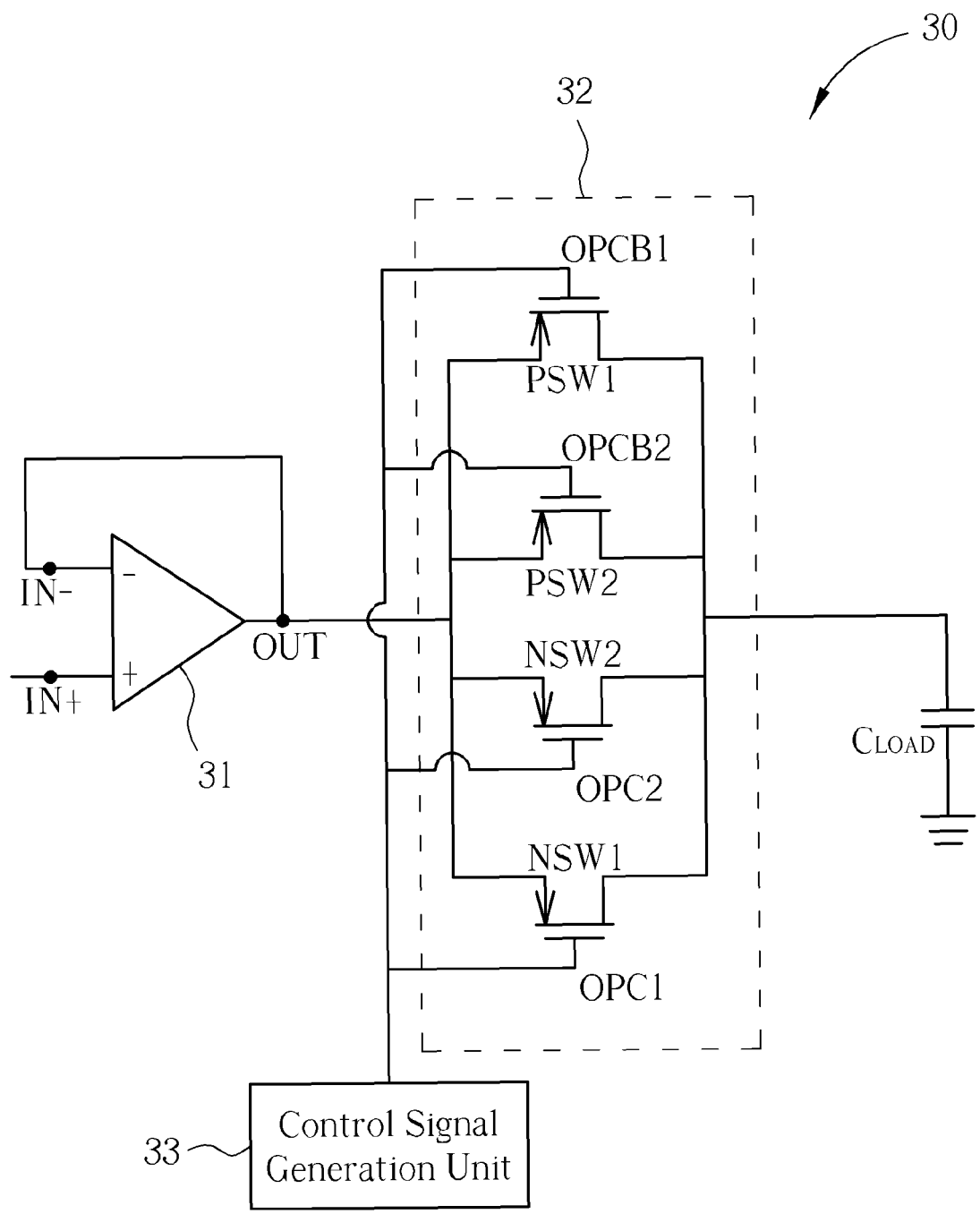
FIG. 3 is a schematic diagram of an output buffer circuit according to an embodiment of the present invention.

Please refer to FIG. 3, which is a schematic diagram of an output buffer circuit 30 according to the embodiment of the present invention. The output buffer circuit 30 includes an operational amplifier 31, a capacitive load CLOAD and an output control unit 32. The operational amplifier 31 has a positive input terminal IN+, a negative input terminal IN−, and an output terminal OUT. The positive input terminal IN+ is utilized for receiving an analog voltage. The output terminal OUTPUT is coupled to the negative input terminal IN− to form a negative feedback loop. The operational amplifier 31 generates a corresponding output voltage to the output terminal OUT according to the analog voltage received by the positive input terminal IN+. The output control unit 32, coupled between the output terminal OUT of the operational amplifier 31 and the capacitive load CLOAD, is utilized for controlling electrical connection between the output terminal OUT of the operational amplifier 31 and the capacitive load CLOAD to form a signal output path, and for adjusting impedance of the signal output path when the signal output path is formed.

Therefore, when the operational amplifier 31 charges the capacitive load CLOAD, the embodiment of the present invention adjusts the impedance of the signal output path to control zero point locations of the operational amplifier, so as to increase phase margin of the operational amplifier. As a result, the stability of the whole system is enhanced and the stabilization time and the testing cost are thus reduced.

In the embodiment of the present invention, the output control unit 32 may include a plurality of output switches, for turning on or off the electrical connection between the output terminal OUT of the operational amplifier 31 and the capacitive load CLOAD to form the signal output path. In this case, the impedance of the signal output path is then determined by the quantity of the turned-on switches.

Figure 4:
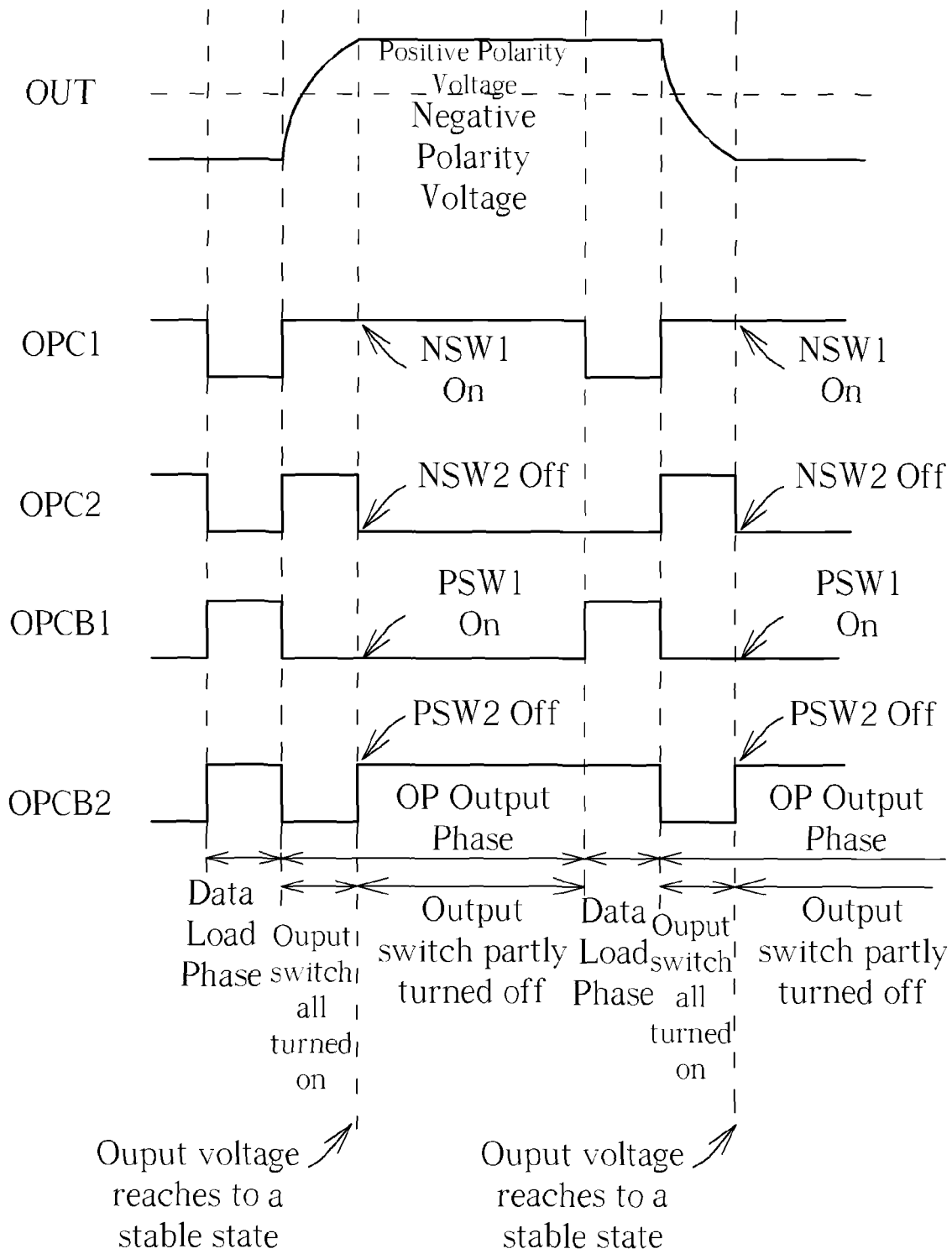
FIG. 4 is a signal timing diagram of the output buffer circuit in FIG. 3.

In FIG. 3, for example, the output control unit 32 includes two CMOS transmission gates, each composed of a PMOS switch (PSW1 and PSW2) and an NMOS switch (NSW1 and NSW2), for performing switch operation according to control signals OPC1 and OPC2 and inversion signals OPCB1 and OPCB2 thereof. Principles and detailed operations of the CMOS transmission gates are well-known by those skilled in the art, and thus are not further narrated herein. Please refer to FIG. 4, which is a signal timing diagram of the output buffer circuit 30. At first, the operational amplifier 31 receives an analog voltage from the output of a front circuit in a data load phase. Then, when the output buffer circuit 30 intends to charge the capacitive load CLOAD by the output voltage of the operational amplifier 31 (i.e. in an output phase of the operational amplifier), all the PMOS switches PSW1, PSW2 and the NMOS switches NSW1, NSW2 are turned on. At this time, the impedance of the signal path between the operational amplifier 31 and the capacitive load CLOAD becomes a minimum value such that the operational amplifier 31 can charge and discharge the capacitive load CLOAD quickly. When the capacitive load CLOAD is charged to a predetermined level (or being charged for a predetermined time), some of the CMOS transmission gates such as the switches NSW2 and PSW2, for example, are turned off, for increasing the impedance of the signal path between the operational amplifier 31 and the capacitive load CLOAD.

In this way, the zero-point positions of the operational amplifier can be controlled by the impedance of the signal output path, so as to increase the phase margin of the operational amplifier. As a result, the stability of the whole system is enhanced and thus the stabilization time and the testing cost can be reduced.

In addition, the control signals OPC1, OPC2 and the inversion signals OPCB1, OPCB2 thereof are generated by a control signal generation unit 33. The control signal generation unit 33 switches logic levels of the control signals OPC1, OPC2 and the inversion signals OPCB1, OPCB2 to turn off some of the transmission gates when the voltage level of the capacitive load CLOAD reaches to a stable state, such as when the capacitive load CLOAD is charged to a predetermined level or a predetermined time after the output phase of the operational amplifier begins, for example.

Please note that, in the embodiment of the present invention, the plurality of output switches included by the output control unit 32 are implemented by the CMOS transmission gates in order to meet requirements of a variety of output voltage levels of the operational amplifiers. However, in other embodiments of the present invention, each output switch can be implemented by any kind of transistor switches such as PMOS switches, NMOS switches or bipolar transistor switches, etc, and is not restricted herein.

Figure 5:
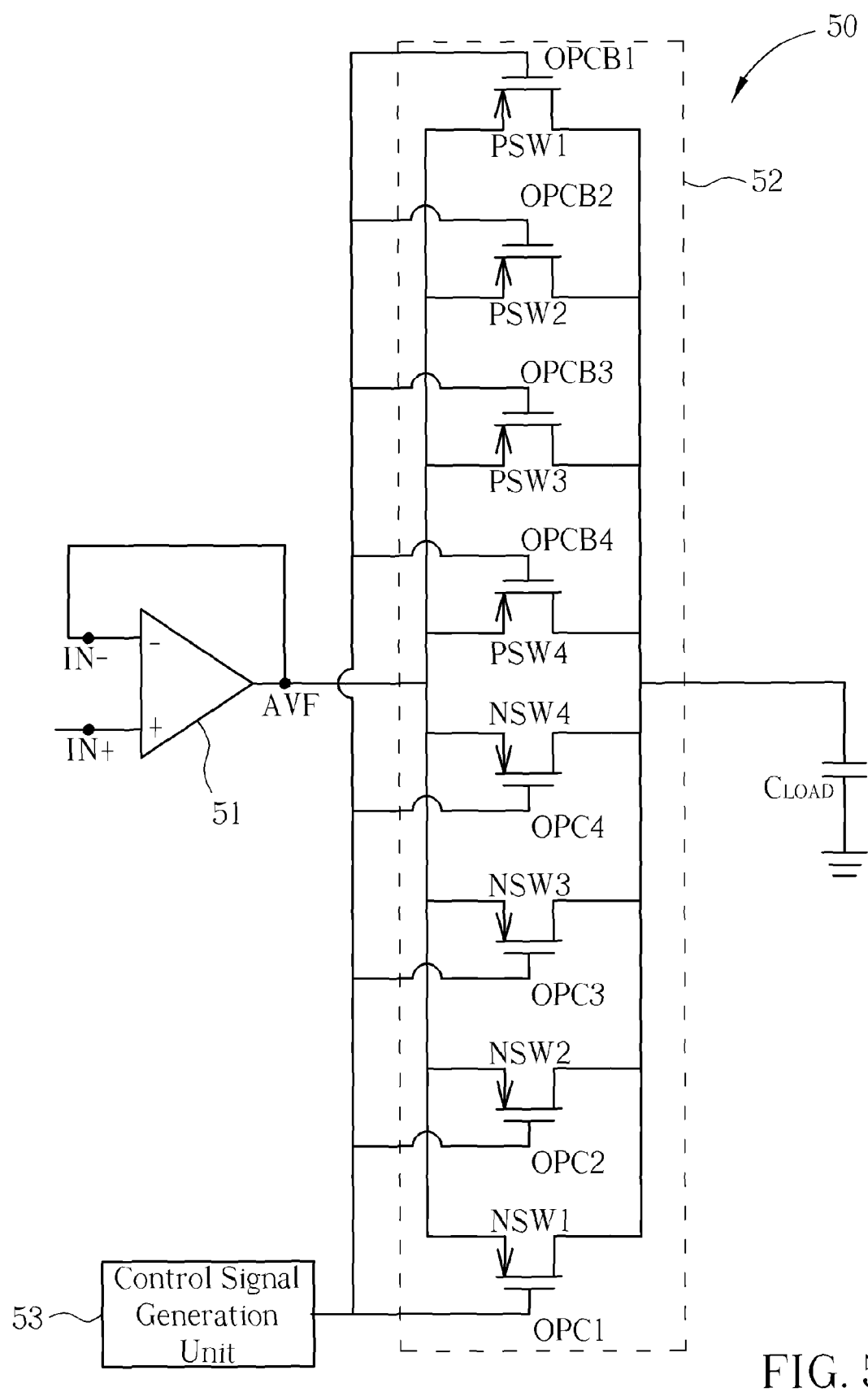
FIG. 5 is a schematic diagram of an output buffer circuit according to another embodiment of the present invention.
Figure 6:
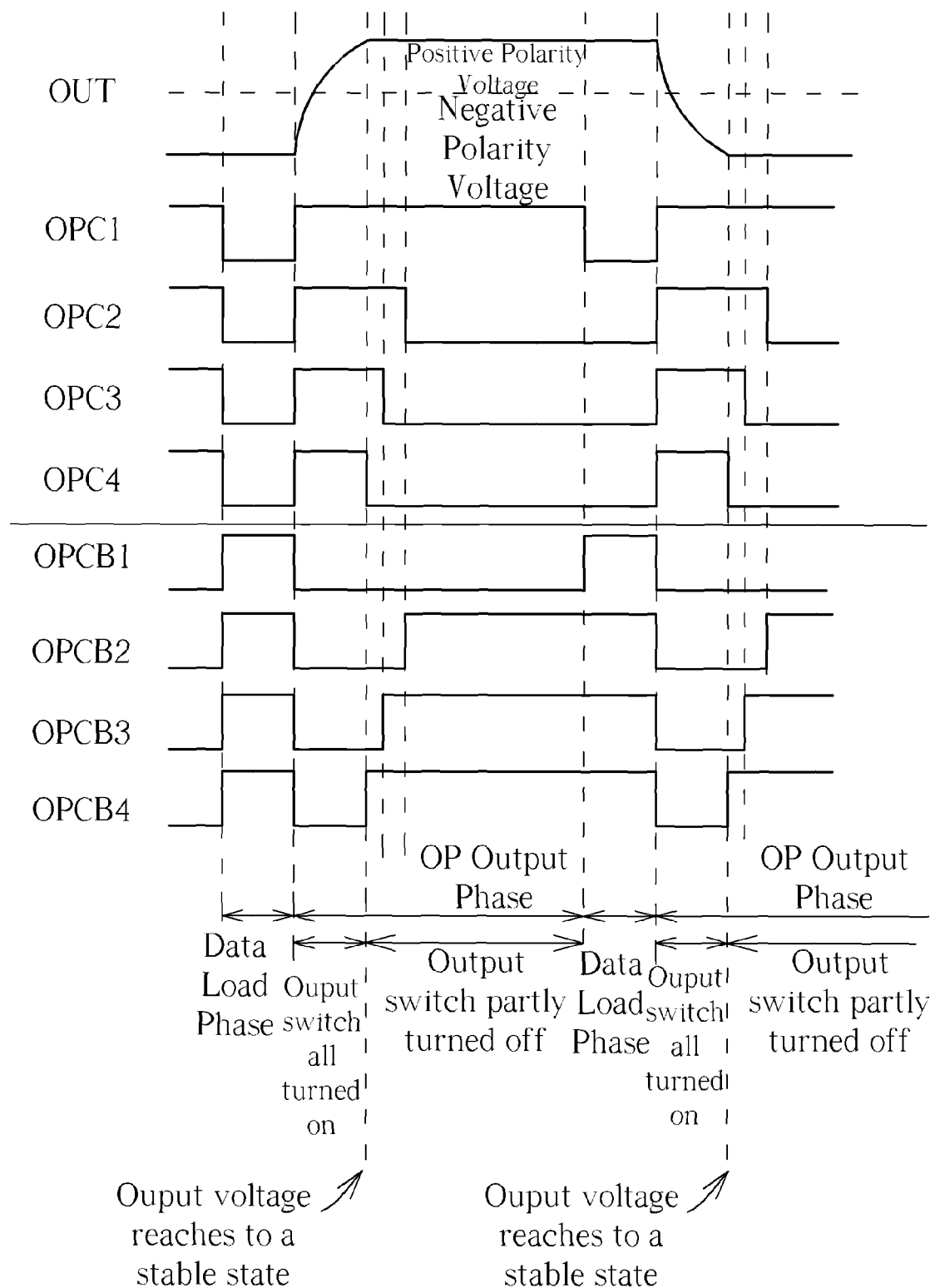
FIG. 6 is a signal timing diagram of the output buffer circuit in FIG. 5.

Certainly, the output switch quantity of the output control unit 32 can be adjusted according to actual demands and is not limited to this. Please refer to FIG. 5, which is a schematic diagram of an output buffer circuit 50 according to another embodiment of the present invention. Compared to the output buffer circuit 30 of FIG. 3, the output control unit 52 includes four pairs of transmission gates, each composed of a PMOS switch (PSW3-PSW6) and an NMOS switch (NSW3-NSW6), for performing switch operations according to control signals OPC3-OPC6 and inversion signals OPCB3-OPCB6 thereof, respectively. Please refer to FIG. 6, which is a signal timing diagram of the output buffer circuit 50. Similarly, in a data load phase, the operational amplifier 51 receives an analog voltage from the output of a front circuit. Then, when the output buffer circuit 50 intends to charge the capacitive load CLOAD by the output voltage of the operational amplifier 51 (i.e. in an output phase of the operational amplifier), all the PMOS switches PSW3-PSW6 and the NMOS switches NSW3-NSW6 are turned on. At this time, the impedance of the signal path between the operational amplifier 51 and the capacitive load CLOAD becomes a minimum value, such that the operational amplifier 51 can charge or discharge the capacitive load CLOAD quickly. When the capacitive load CLOAD is charged to a predetermined level (or being charged for a predetermined time), the CMOS transmission gates are sequentially turned off to gradually increase the impedance of the signal path between the operational amplifier 51 and the capacitive load CLOAD.

In this way, during the process that the output switches are sequentially turned off, the output path of the operational amplifier has impedance larger than the condition when all the output switches are turned on, so that the phase margin of the operational amplifier is increased. As a result, the stability of the whole system is enhanced, so as to reduce the stabilization time and the testing cost.

Figure 7:
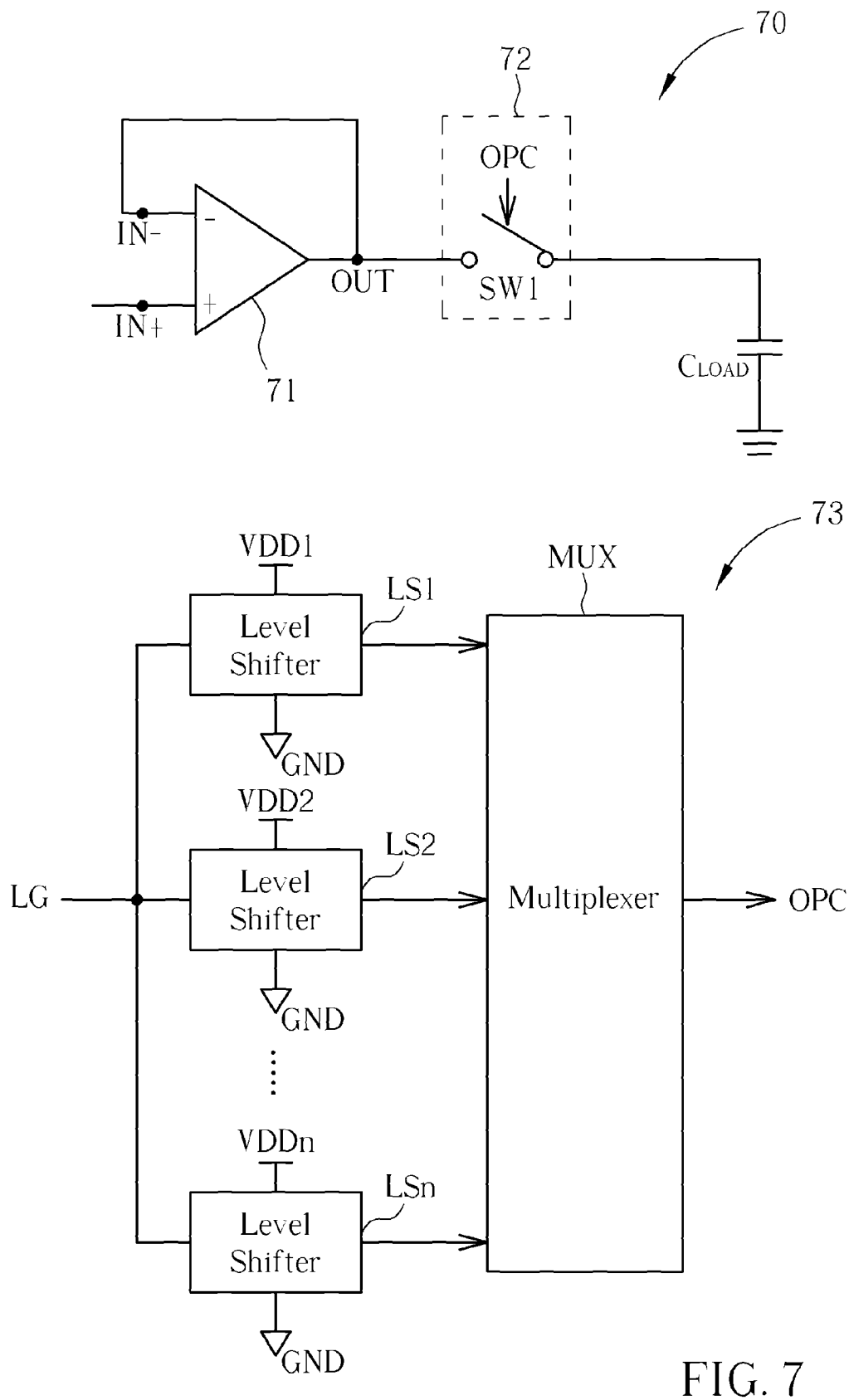
FIG. 7 is a schematic diagram of an output buffer circuit according to further another embodiment of the present invention.

On the other hand, please refer to FIG. 7, which is a schematic diagram of an output buffer circuit 70 according to another embodiment of the present invention. The output buffer circuit 70 includes an operational amplifier 71, a capacitive load CLOAD and an output control unit 72. Compared to the above embodiments, the output control unit 72 only includes one output switch SW1 for turning on or off the electrical connection between the output terminal OUT of the operational amplifier 71 and the capacitive load CLOAD according to a control signal OPC, so as to form a signal output path. The control signal OPC is generated by a control signal generation unit 73. When the voltage level of the capacitive load CLOAD reaches to a stable state such as when the capacitive load CLOAD is charged to a predetermined voltage level, or a predetermined time after the operational amplifier enters into the output phase, for example, the control signal generation unit 73 adjusts the voltage level of the control signal OPC to control conductivity of the output switch SW1. In this way, the impedance of the signal output path can be adjusted according to the conductivity of the output switch SW1.

That is to say, when the output buffer circuit 70 intends to charge the capacitive load CLOAD by the output voltage of the operational amplifier 71, the output switch SW1 would be turned on completely. At this time, the impedance of the signal path between the operational amplifier 71 and the capacitive load CLOAD becomes a minimum value, such that the operational amplifier 71 can charge or discharge the capacitive load CLOAD quickly. When the capacitive load CLOAD is charged to a stable state such as reaching to a predetermined voltage level or being charged for a predetermined period, for example, the output switch SW1 would be switched to an incomplete conduction state according to level variation of the control signal OPC, such that the impedance of the signal path between the operational amplifier 71 and the capacitive load CLOAD is increased.

In general, the control signals of the output switches are generated by low-voltage logic circuits. Thus, level shifters are required to transform the control signals to the level of high-voltage components, such that the output switches can be turned on or off by the control signals. In the embodiment of the present invention, the control signal generation unit 73 includes level shifters LS1-LSn, and a multiplexer MUX. The level shifters LS1-LSn generate supply voltages VDD1~VDDn according to a logic signal LG, respectively. The multiplexer MUX is coupled to the level shifters LS1-LSn, and is utilized for switching the supply voltages VDD1~VDDn according to the voltage of the capacitive load CLOAD, to generate the control signal OPC of the output switch SW1. The relationship of the supply voltages VDD1~VDDn is as follows: VDD1>VDD2> . . . > VDDn>GND.

In the embodiment of the present invention, the output switch SW1 is completely turned on when the control signal OPC has a level of VDD1, and is completely turned off when the control signal OPC has a level of GND. Since the output switch SW1 is implemented by a CMOS transmission gate, by the conduction characteristics of CMOS devices, the impedance of the output switch SW1 is higher when the control signal OPC has a level less than the supply voltage VDD1 than when the output switch SW1 is turned on completely. The increase of the impedance affects the zero position of the operational amplifier, to improve the phase margin of the operational amplifier and shorten the stabilization time of the output buffer circuit.

In short, the embodiment of the present invention varies the transistor gate voltage of the output switch to control the output path impedance of the operational amplifier, so as to shorten the stabilization time of the output buffer circuit. Certainly, the spirit of the above embodiment is not limited to the case shown in the figure. All output buffer circuits that adjust the impedance of the signal output path to improve the stability of the output buffer circuit belong to the scope of the present invention.

To sum up, the output buffer circuit of the present invention controls the output path impedance of the operational amplifier to adjust the zero position of the operational amplifier, so as to shorten the stabilization time and the testing time. As a result, the testing cost of the source driver can be effectively reduced, while the competitiveness is raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output buffer circuit capable of enhancing stability, comprising:
an operational amplifier, having an output terminal; and
an output control unit, coupled between the output terminal of the operational amplifier and capacitive load, to generate a variable impedance of a signal output path between the output terminal of the operational amplifier and the capacitive load, wherein when the operational amplifier enters an output phase to charge or discharge the capacitive load, the output control circuit generates a first impedance, and when a voltage level of the capacitive load is detected to reach a predetermined level, the output control circuit generates a second impedance larger than the first impedance.

2. The output buffer circuit of claim 1 being applicable to a display driving circuit.

3. The output buffer circuit of claim 2, wherein the display driving circuit is a source driver.

4. The output buffer circuit of claim 1, wherein the output control unit comprising:
a plurality of output switches, wherein the impedance of the signal output path is determined by a quantity of turned-on output switches among the plurality of output switches.

5. The output buffer circuit of claim 4, wherein the plurality of output switches are all turned on when the operational amplifier enters the output phase, and partly turned off to increase the impedance of the signal output path when the voltage level of the capacitive load is detected to reach the predetermined level.

6. The output buffer circuit of claim 5, wherein the partly-turned-off output switches are sequentially turned off to gradually increase the impedance of the signal output path when the voltage level of the capacitive load is detected to reach the predetermined level.

7. The output buffer circuit of claim 4, wherein each of the plurality of output switches is implemented by a PMOS switch, an NMOS switch, or a CMOS transmission gate.

8. The output buffer circuit of claim 4 further comprising a control signal generation unit, coupled to the plurality of output switches, for detecting a voltage level of the capacitive load and generating control signals of the plurality of output switches, to control the quantity of the turned-on output switches among the plurality of the output switches according to the detected voltage level of the capacitive load.

9. The output buffer circuit of claim 4, wherein the output control unit gradually increases the impedance of the signal output path after the voltage level of the capacitive load is detected to reach the predetermined level.

10. The output buffer circuit of claim 1, wherein the output control unit comprises an output switch, for turning on or off the electrical connection between the output terminal and the capacitive load of the operational amplifier, to form the signal output path, wherein the impedance of the signal output path is determined by a conductivity of the output switch.

11. The output buffer circuit of claim 10, further comprising a control signal generation unit, coupled to the output switch, for detecting a voltage level of the capacitive load and generating a control signal of the output switch, to control the conductivity of the output switch according to the voltage level of the capacitive load.

12. The output buffer circuit of claim 11, wherein the control signal generation unit comprises:
   a plurality of level shifters, for individually generating a plurality of supply voltage levels according to a logic signal; and
   a multiplexer, coupled to the plurality of level shifters, for switching the plurality of supply voltage levels, to output as the control signal.

13. The output buffer circuit of claim 10, wherein the output switch is turned on when the operational amplifier enters the output phase, and partly turned off to increase the impedance of the signal output path when the voltage level of the capacitive load is detected to reach the predetermined level.

14. The output buffer circuit of claim 13, wherein the partly-turned off output switch is gradually turned off to gradually increase the impedance of the signal output path when the voltage level of the capacitive load is detected to reach the predetermined level.

15. An output buffer circuit capable of enhancing stability, comprising:
   an operational amplifier, having an output terminal; and
   an output control unit, coupled between the output terminal of the operational amplifier and a capacitive load, to generate a variable impedance between the output terminal of the operational amplifier and the capacitive load, wherein the operational amplifier enters an output phase to charge or discharge the capacitive load, the output control circuit generate a first impedance, and the output control circuit generate a second impedance larger than the first impedance after the operational amplifier operates in the output phase for a predetermined time.

16. The output buffer circuit of claim 15, wherein the output control unit comprises:
   a plurality of output switches, wherein the impedance of the signal output path is determined by a quantity of turned-on output switches among the plurality of output switches.

17. The output buffer circuit of claim 15, wherein the plurality of output switches are all turned on when the operational amplifier enters the output phase, and partly turned off to increase the impedance of the signal output path after the operational amplifier operates in the output phase for a predetermined time.

18. The output buffer circuit of claim 17, wherein the partly-turned-off output switches are sequentially turned off to gradually increase the impedance of the signal output path when the voltage level of the capacitive load is detected to reach the predetermined level.

19. The output buffer circuit of claim 15, wherein each of the plurality of output switches is implemented by a PMOS switch, an NMOS switch, or a CMOS transmission gate.

20. The output buffer circuit of claim 15 further comprising a control signal generation unit, coupled to the plurality of output switches, for detecting whether the operational amplifier operates in the output phase for the predetermined time and generating control signals of the plurality of output switches, to control a quantity of the turned-on output switches among the plurality of the output switches according to a result of the detection.

21. The output buffer circuit of claim 15 being applicable to a display driving circuit.

22. The output buffer circuit of claim 21, wherein the display driving circuit is a source driver.

23. The output buffer circuit of claim 15, wherein the output control unit gradually increases the impedance of the signal output path after the operational amplifier operates in the output phase for the predetermined time.

24. The output buffer circuit of claim 15, wherein the output control unit comprises an output switch, for turning on or off the electrical connection between the output terminal and the capacitive load of the operational amplifier, to form the signal output path, wherein the impedance of the signal output path is determined by conductivity of the output switch.

25. The output buffer circuit of claim 24, further comprising a control signal generation unit, coupled to the output switch, for detecting a voltage level of the capacitive load and generating a control signal of the output switch, to control the conductivity of the output switch according to the voltage level of the capacitive load.

26. The output buffer circuit of claim 25, wherein the control signal generation unit comprises:
   a plurality of level shifters, for individually generating a plurality of supply voltage levels according to a logic signal; and
   a multiplexer, coupled to the plurality of level shifters, for switching the plurality of supply voltage levels, to output as the control signal.

27. The output buffer circuit of claim 15, wherein the output switch is turned on when the operational amplifier enters the output phase, and partly turned off to increase the impedance of the signal output path when the voltage level of the capacitive load is detected to reach the predetermined level.

28. The output buffer circuit of claim 27, wherein the partly-turned off output switch is gradually turned off to gradually increase the impedance of the signal output path when the voltage level of the capacitive load is detected to reach the predetermined level.

29. An output buffer circuit capable of enhancing stability, comprising:
   an operational amplifier, having an output terminal; and
   an output control unit, coupled between the output terminal of the operational amplifier and a capacitive load, to generate a variable impedance of a signal output path between the output terminal of the operational amplifier and the capacitive load, wherein the operational amplifier enters an output phase to charge or discharge the capacitive load, and the output control circuit gradually increase the impedance of a signal output path when a voltage level of the capacitive load reaches to a stable state.

30. The output buffer circuit of claim 29, wherein the output control unit comprising:
   a plurality of output switches, wherein the impedance of the signal output path is determined by a quantity of turned-on output switches among the plurality of output switches.

31. The output buffer circuit of claim 30, wherein the plurality of output switches are all turned on when the operational amplifier enters the output phase, and sequentially turned off to gradually increase the impedance of the signal output path after the voltage level of the capacitive load reaches to the stable state.

32. The output buffer circuit of claim 29, wherein the output control unit comprises an output switch, for turning on or off the electrical connection between the output terminal and the capacitive load of the operational amplifier, to form the signal output path, wherein the impedance of the signal output path is determined by conductivity of the output switch.

33. The output buffer circuit of claim 32, wherein the output switch is turned on when the operational amplifier enters the output phase, and gradually turned off to gradually increase the impedance of the signal output path after the voltage level of the capacitive load reaches to the stable state.

\* \* \* \* \*